United States Patent [19]

Sei et al.

[11] Patent Number: 5,786,055
[45] Date of Patent: Jul. 28, 1998

[54] ADHESIVE FOR SEMICONDUCTOR DEVICES AND ADHESIVE TAPE USING THE ADHESIVE

[75] Inventors: Akinori Sei; Yoshikazu Tsukamoto; Takashi Shiozawa; Shouji Aoki; Tadahiro Oishi; Hitoshi Narushima, all of Shizuoka, Japan

[73] Assignee: Tomoegawa Paper Co., Ltd., Tokyo, Japan

[21] Appl. No.: 382,157

[22] Filed: Feb. 1, 1995

[30] Foreign Application Priority Data

Feb. 4, 1994 [JP] Japan ................... 6-032900

[51] Int. Cl.$^6$ ................... A21H 19/00; C09J 7/02
[52] U.S. Cl. ................... 428/42; 528/129; 528/153; 525/420; 525/427; 525/429; 428/42; 428/344; 428/349; 428/354; 428/355; 428/474.4
[58] Field of Search ................... 528/129, 153; 525/420, 427, 429; 428/42, 344, 349, 354, 355, 474.4

[56] References Cited

U.S. PATENT DOCUMENTS

| 5,290,614 | 3/1994 | Narushima et al. | 428/40 |
| 5,298,304 | 3/1994 | Narushima et al. | 428/40 |
| 5,523,137 | 6/1996 | Sei et al. | 428/41.7 |

*Primary Examiner*—Samuel A. Acquah
*Attorney, Agent, or Firm*—Wenderoth, Lind & Ponack

[57] ABSTRACT

An adhesive for semiconductor device, comprising (a) a polyamide resin having an amine value of 20 to 60 and a weight average molecular weight of 1,000 to 5,000 and (b) a phenolic compound having a weight average molecular weight of 2,000 or less and having a skeleton containing at least 2 methylol groups.

8 Claims, 3 Drawing Sheets

ADHESIVE FOR SEMICONDUCTOR DEVICES AND ADHESIVE TAPE USING THE ADHESIVE

FIELD OF THE INVENTION

The present invention relates to an adhesive used in the step of assembling semiconductor devices. More specifically, it relates to an adhesive or an adhesive in the form of a sheet, which is suitable for requirements of an increase in the number of pins of a device, the downsizing of a device and high-density mounting. Further, it relates to an adhesive tape comprising a three-layered structure of a protection film, an adhesive layer and an organic insulation film, suitable for use in a mounting method using a TAB method or a TAB tape.

PRIOR ART OF THE INVENTION

Generally, a conventional adhesive for semiconductor devices comprises a polyamide resin and a curing component such as an epoxy resin, a phenolic resin or a maleimide resin. In particular, an epoxy resin has been considered essential as a raw material for an adhesive for semiconductor devices. However, an epoxy resin contains residual halogen ions such as chloride ion, etc., as impurities, since epihalohydrin such as epichlorohydrin is used as a raw material for the production of the epoxy resin, and it is impossible to remove these impurities completely. As a result, conventional adhesives contain chloride ion, etc.

In recent years, the downsizing of semiconductor devices is under way, and internal wirings are therefore coming to close to one another. As a result, parts or materials, such as an adhesive, used for semiconductor devices are required to have highly improved properties. In particular, it is strongly required to improve electrical-insulation reliability and heat resistance. For improving the electrical-insulation reliability, it is required to remove chloride ion from an adhesive completely. This requirement can be complied with by producing an adhesive containing no conventional epoxy resin as a curing component. The curing component serves to improve the adhesive in heat resistance and chemical resistance after the adhesive is cured. The present inventors have made studies in various ways, and have found the following. For improving the heat resistance and chemical resistance without using any epoxy resin as a curing agent, it is sufficient to increase the density of a network structure.

SUMMARY OF THE INVENTION

It is an object of the present invention to provide an adhesive for semiconductor devices, which can satisfy the requirements to improve the electrical insulation and heat resistance of an adhesive for semiconductor devices.

It is another object of the present invention to provide an adhesive for semiconductor device, which has improved electrical-insulation reliability so that it can cope with the downsizing of semiconductor devices, i.e., fine-pitch leads.

It is still another object of the present invention to provide an adhesive for semiconductor devices, which is improved in the prevention of the softening and deterioration of the adhesive at high temperatures, and which has excellent bonding properties.

It is further another object of the present invention to provide an adhesive for semiconductor devices, which enables a transfer mold mounting method using a TAB tape and a wire bonding mounting method using a TAB tape, which methods are conventionally difficult to carry out when a conventional adhesive for semiconductor devices is used.

It is still further another object of the present invention to provide an adhesive in the form of a sheet or an adhesive tape, which has improved heat resistance and improved electric-insulation reliability required of an adhesive for bonding semiconductor device members in a semiconductor device.

According to the present invention, there is provided an adhesive for semiconductor device, comprising (a) a polyamide resin having an amine value of 20 to 60 and a weight average molecular weight of 1,000 to 5,000 and (b) a phenolic compound having a weight average molecular weight of 2,000 or less and having at least 2 methylol groups per monomer molecule.

Further, according to the present invention, there is provided an adhesive for semiconductor devices, obtained from (a) a polyamide resin having an amine value of 20 to 60 and a weight average molecular weight of 1,000 to 5,000 and (b) a phenolic compound having a weight average molecular weight of 2,000 or less and containing, as a phenolic component, a phenol monomer having at least 2 methylol groups per monomer molecule or a dimer or trimer of the phenol monomer.

Further, according to the present invention, there is provided an adhesive sheet for semiconductor devices, or an adhesive tape for semiconductor devices, which is formed by laminating a layer of the above adhesive on a protection film and laminating an organic insulation film on the layer of the adhesive.

DETAILED DESCRIPTION OF THE INVENTION

Figure 1:
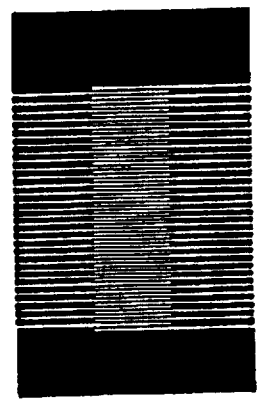
FIG. 1 shows a schematic pattern of comb-like electrodes used in Examples.
Figure 2:
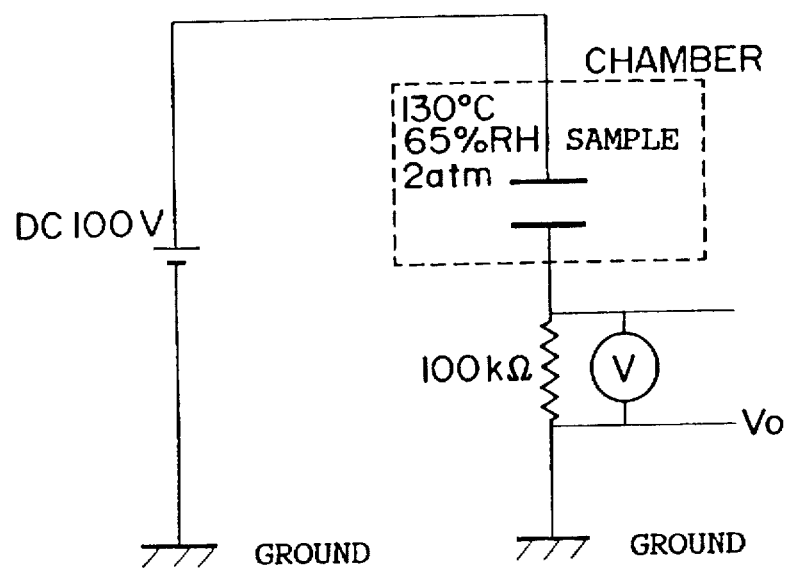
FIG. 2 shows a schematic electric circuit of surface electrodes used in Examples.

The polyamide resin used in the present invention has an amine value of 20 to 60 and a weight average molecular weight of 1,000 to 5,000. The polyamide resin forms a cured product together with a phenolic compound. The adhesive for semiconductor devices is required to have heat resistance and chemical resistance. The adhesive layer is required to have flexibility and adhesion strength to an organic insulating film such as a polyimide film. For satisfying these requirements, a plurality of polyamide resins having different molecular weights and/or amine values may be used. Polyamide resins are generically referred to as nylon, and obtained by copolymerizing various acids and amines. The acids include dimer acids and trimer acids. The amines include polyamines having at least two amino groups.

The polyamide resin used in the present invention is required to react with the phenolic compound. When the polyamide resin is produced by copolymerization, an excess of the amine in equivalent ratio is incorporated, so that the polyamide resin has terminals formed of residual unreacted amine. As a result of studies by the present inventors, a polyamide resin having an amine value of 20 to 60 is preferred for obtaining a cured adhesive having improved adhesion strength, improved chemical resistance and improved heat resistance. When the above amine value is less than 20, the intermolecular crosslinking degree is low, and the cured adhesive shows decreased heat resistance and decreased electrical insulation. When the amine value exceeds 60, a coating composition for forming the adhesive layer is liable to for a gel, and the coating composition shows poor stability. Further, the polyamide resin used in the present invention is selected from polyamide resins having a weight average molecular weight of 1,000 to 5,000. When the weight average molecular weight is less than 1,000, the adhesive shows poor film formability, since this weight average molecular weight is too small for an elastomer component. When the weight average molecular weight exceeds 5,000, the inter-crosslinking-point molecular weight is too large to secure heat resistance and chemical resistance.

The polyamide resin used in the present invention has a smaller molecular weight than conventional polyamide resins such as polyamide resins having a molecular weight of 30,000 to 150,000. When the polyamide resin having a smaller molecular weight is used in the present invention, a cured adhesive has a small, inter-crosslinking-point molecular weight. As a result, the cured adhesive shows improved chemical resistance and heat resistance.

The amount of the polyamide resin per 100 parts by weight of the phenolic compound is 50 to 500 parts by weight.

The amine value of the polyamide resin refers to the weight (unit: mg) of KOH equivalent to aminic alkali present in 1 g of a sample of the polyamide resin. The amine value is measured by dissolving a polyamide resin in a toluene/n-butanol (1/1) mixture and carrying out the neutralization titration with a 0.5N hydrochloric acid aqueous solution.

In the present invention, other elastomer may be added in addition to the above polyamide resin, for imparting the adhesive with adhesion properties and flexibility. The "other" elastomer includes a polyamide resin other than the above polyamide resin used in the present invention, a polyester resin, NBR, SBR and a polyvinyl acetal resin.

The phenolic compound used in the present invention is a compound which has at least 2 methylol groups in its skeleton and which has a weight average molecular weight of 2,000 or less, preferably 150 to 1,500. At least two methylol groups are necessary for a crosslinking reaction.

When the molecular weight of the phenolic compound exceeds the above upper limit, a cured product obtained by the reaction of the phenolic compound with the polyamide has a large inter-crosslinking-point molecular weight (large molecular weight between crosslinking points) and has the structure of a relatively coarse network. That is, the crosslinking is insufficient. As a result, the cured adhesive is insufficient in heat resistance, chemical resistance and electrical-insulation reliability.

The phenolic compound used in the present invention has a skeleton containing a phenolic compound of the following formula or a condensate thereof,

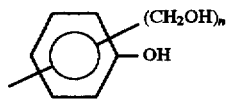

wherein n=2 or 3.

The phenolic compound used in the present invention includes methylolphenol compounds such as 2,3-bis(hydroxymethyl)phenol, 2,3-bis(hydroxymethyl)-α-naphthol, 2,3-bis(hydroxymethyl)-β-naphthol, 2,6-bis(hydroxymethyl)-p-cresol and trimethylolallyloxyphenol; dehydrated condensates of the methylolphenol compounds; and resins of a resolphenol type. These compounds may be used alone or in combination.

The resins of a resolphenol type are resins of a phenol type, resins of a bisphenol A type and resins of an alkylphenol type. The resins of an alkylphenol type include resins having a methyl, ethyl, propyl, t-butyl or nonyl group on the o- or p-position relative to their phenolic hydroxyl group.

A reaction product from any one of these phenolic compound and the polyamide resin is an insoluble and infusible solid, and improves the adhesive in adhesion strength, electrical-insulation reliability, chemical resistance and heat resistance.

In the present invention, the weight average molecular weights of the polyamide resin and the phenolic compound refer to values of weight average molecular weight as polystyrene, obtained by subjecting them to a gel permeation chromatography method (GPC method) using polystyrene as standard substance and calibrating obtained data.

In the present invention, the adhesive for semiconductor devices may be in the form of a sheet prepared by forming a layer of the adhesive on a protection film or a sheet having a structure in which a protection film is present on one surface of a layer of the adhesive and other protection film is present on the other surface of the layer. Further, the adhesive for semiconductor devices may be in the form of a tape having a structure in which an organic insulation film is present on one surface of a layer of the adhesive and a protection film is present on the other surface of the layer. A tape composed basically of an organic insulation film and an adhesive layer is usually called a TAB tape.

The method of the production of a TAB tape will be explained hereinafter.

The adhesive is applied to a protection film, and dried at about 150° to 180° C. for about 2 minutes to bring the adhesive into a semi-cured state. Then, an organic insulation film is stacked on the so-formed adhesive layer and attached under heat at about 100° to 130° C. at a pressure of at least 1 kg/cm². The resultant tape for TAB is taken up in the form of a roll. The width and length of the tape are not specially limited, while the tape in the form of a roll generally has a width of 30 to 200 mm and a length of 30 to 300 m.

The adhesive tape for TAB is generally processed as follows to produce a TAB tape.

1) The tape is stamped to make sprocket and device holes.
2) A copper foil is attached to the tape having the holes under heat and pressure, and the adhesive is cured by heating.
3) A photoresist is applied to the copper foil, exposed to ultraviolet light, or the like through a mask, and developed.
4) A liner is applied to the device hole, the copper foil is etched. Then, the resist is removed, and the liner is removed to form a circuit. A solder resist is applied.
5) Tin or gold plating is conducted.

A chip is bonded to the inner leads of the above-obtained TAB tape, the leads are cut off, the outer leads of the TAB tape are bonded to a printed circuit board, and the chip and/or the TAB tape is molded with a resin. Alternatively, after the bonding of inner leads, the chip is molded with a resin, and the leads and peripheral circuits are cut off, and the outer leads of the TAB tape are bonded to a printed circuit board.

The film suitable as an organic insulation film includes heat-resistant films such as a polyimide film, a polyether imide film, a polyphenylene sulfide film and a polyether ketone film, and composite heat-resistant films such as an epoxy resin-glass cloth and an epoxy resin-polyimide-glass cloth. The organic insulation film may be surface-modified (treated) in advance for improving the adhesion to the adhesive. The surface treatment may be carried out by corona discharging treatment, plasma treatment, chemical-ethching treatment or sand blast treatment. The thickness of the organic insulation film is generally 25 to 188 µm, preferably 25 to 125 µm. The thickness of the dry adhesive layer is preferably 3 to 20 µm.

The film suitable as a protection film includes a polyethylene film, a polyethylene terephthalate film and a polypropylene film. The protection film is peeled off before the tape is used. For this purpose, it is preferred to apply silicone or alkyd-modified silicone to the protection film surface in advance so that the protection film can be easily peeled off.

The adhesive for semiconductor devices, provided by the present invention, has a small inter-crosslinking-point molecular weight as compared with conventional adhesives for semiconductor devices, and it is therefore excellent in heat resistance and chemical resistance and shows higher electrical insulation reliability. As a result, the adhesive for semiconductor devices, provided by the present invention, is free from causing displacement of a lead pattern (which is a circuit formed by etching a copper foil) and the sinking of the lead pattern into the adhesive at a high temperature under high pressure. The TAB tape using the adhesive of the present invention is suitable various high-density semiconductor mountings such as fine pitch semiconductor mounting, transfer mold package mounting and wire bonding.

The present invention will be explained more in detail hereinafter with reference to Examples, in which "part" and "%" stand for "part by weight" and "% by weight" unless otherwise specified.

Example 1

A coating composition containing the following components was applied to the surface of a polyethylene terephthalate film having a thickness of 38 µm, and dried at 160° C. for 2 minutes to form an adhesive layer having a thickness of 20µ.

A solution of 25% of a polyamide resin (weight average molecular weight: 2,300, amine value: 50) in an isopropyl alcohol/toluene (1/1) mixed solvent 100 parts A solution of 25% of a phenolic compound (a mixture of a resolphenol resin of bisphenol A type with a resolphenol resin of alkylphenol type, weight average molecular weight: 1,000, "CKM-908", supplied by Showa Highpolymer Co., Ltd.) in toluene. 20 parts A polyimide film having a thickness of 50 µm was placed on the adhesive layer, and attached under heat at 130° C. under a pressure of 1 kg/cm² to prepare a tape for TAB. The polyethylene terephthalate film was removed from this tape, and a ¾ oz electroplated copper foil (thickness: 25–28 µm) was attached to the adhesive surface. Then, the adhesive layer was cured by consecutively heating at 700° C. for 6 hours, at 120° C. for 6 hours and at 160° C. for 6 hours. Further, a photoresist layer was formed on the copper foil, and the copper foil was etched to form a comb-like electrode pattern for the evaluation of the adhesive for electrical insulation reliability.

Separately, a sample for measuring Young's modulus was prepared by consecutively laminating 20 µm thick adhesive layers alone with a high-temperature laminator at 80° to 100° C. to form a sheet having a predetermined thickness, curing them under the above-described curing conditions and cutting the sheet in a predtermined form.

Example 2

A sample was prepared in the same manner as in Example 1 except that the coating composition was replaced with a coating composition containing the following components.

A solution of 25% of a polyamide resin (weight average molecular weight: 2,300, amine value: 50) in an isopropyl alcohol/toluene (1/1) mixed solvent 80 parts A solution of 25% of a phenolic compound (weight average molecular weight: 1,000, "CKM-908", supplied by Showa Highpolymer Co., Ltd.) in toluene. 20 parts A solution of 25 % of a polyamide resin (weight average molecular weight: 50,000, amine value: 0.3) in an isopropyl alcohol/toluene mixed solvent 20 parts Comparative Example 1

A sample was prepared in the same manner as in Example 1 except that the coating composition was replaced with a coating composition containing the following components.

A solution of 25% of a polyamide resin (weight average molecular weight: 150,000, amine value: 0.3) In an isopropyl alcohol/toluene (1/1) mixed solvent 50 parts A solution of 25% of a novolak phenol compound ("CKM-2432", supplied by Showa Kobunshi K. K.) in toluene. 20 parts An epoxy resin ("Epikote 828", supplied by Yuka-Shell Epoxy Co., Ltd.) 10 parts Samples from the tapes for TAB obtained in Examples 1 and 2 and Comparative Example 1 were evaluated for the following properties.

1) Electrical insulation reliability

A predetermined voltage was applied to a comb-like electrode pattern, and a time was counted from the application of the voltage to the initiation of electric current caused by insulation breakdown.

Ambient atmosphere: 130° C., 85% RH, 2 atm Applied voltage: 100 V

Comb-like pattern: as shown in FIG. 1, line width=50µ, line intervals=50 µm.

The surface resistance was observed for a change with setting up a module as shown in FIG. 1 at intervals of 20 minutes for 750 hours. The surface resistance was calculated on the basis of the formula of $(100-V_o) \times 10^5 / V_o$.

Figure 3:
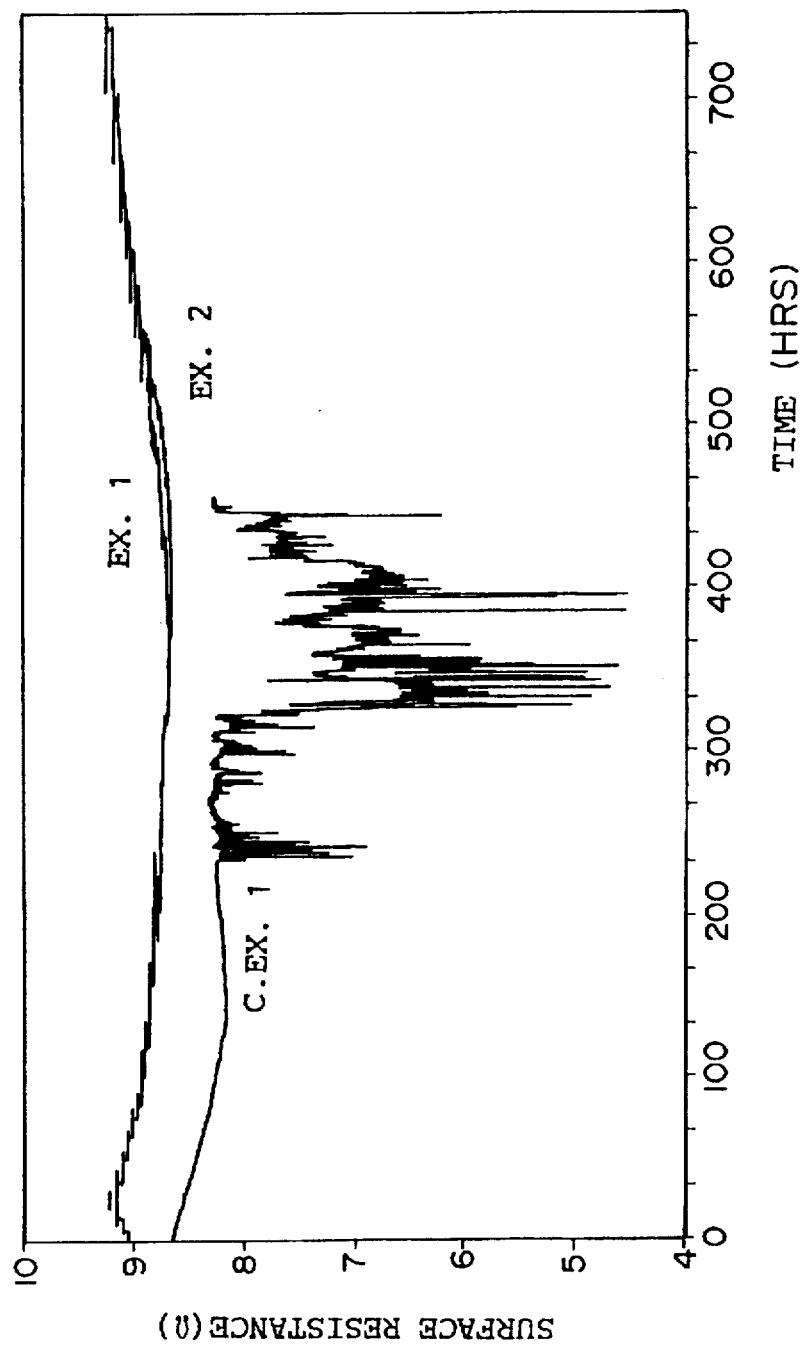
FIG. 3 shows the results of electrical insulation reliability tests carried out in Examples.

FIG. 3 shows the results.

2) Young's modulus

Figure 4:
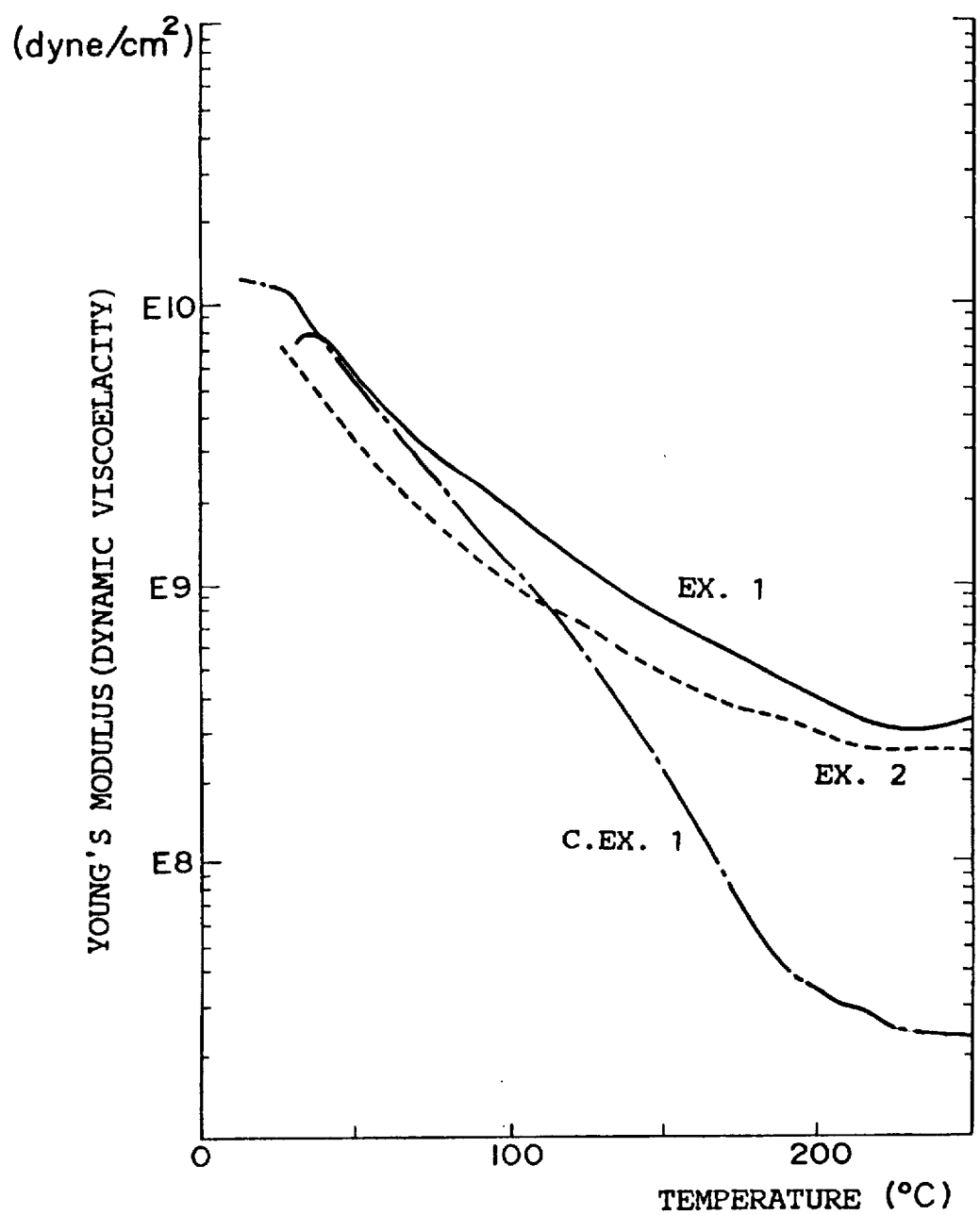
FIG. 4 shows the test results of Young's moduli of samples obtained in Examples.

The samples were measured for Young's moduli in the temperature range of from room temperature to 250° C. The measurement was carried out with RHEOVIBRON DDV-H (supplied by Orientech Co.) at a frequency of 110 Hz at a sample temperature elevation rate of 3° C./minute. FIG. 4 shows the results.

According to the present invention, there is provided an adhesive for semiconductor devices, which shows improved electrical insulation reliability and improved heat resistance. This adhesive for semiconductor devices is highly suitable for complying with demands for higher-quality materials for semiconductor devices, and can provide a sheet of said adhesive and a tape for TAB. More specifically, this adhesive for semiconductor devices shows improved, electrical insulation reliability, and is suitable for forming a finer pattern on a copper foil. Further, this adhesive for semiconductor devices shows improved heat resistance, and is free from causing displacement of a lead pattern and the sinking of the lead pattern into the adhesive which generally occur when inner leads and outer leads are bonded at high temperatures under high pressure. Further, this adhesive for semiconductor devices is less dependent upon temperatures, and is free from a decrease in the adhesion strength to a copper foil and an organic insulation film.

According to the present invention, almost no bonding error occurs in high pin counts bonding, and almost no deformation of leads occurs in conveying and bonding steps. Therefore, the adhesive for semiconductor devices, provided by the present invention, greatly improves the yields.

What is claimed is:

1. An adhesive for semiconductor device, comprising
   (a) a polyamide resin having an amine value of 20 to 60 and a weight average molecular weight of 1,000 to 5,000 and
   (b) a phenolic compound having a weight average molecular weight of 2,000 or less and having a skeleton containing at least 2 methylol groups.

2. An adhesive according to claim 1, wherein the polyamide resin is used in an amount of 50 to 500 parts by weight per 100 parts by weight of the phenolic compound.

3. An adhesive according to claim 1, wherein the phenolic compound is a methylolphenolic compound or a dehydrated condensate thereof.

4. An adhesive according to claim 1, wherein the phenolic compound is a resin of a resolphenol type.

5. An adhesive according to claim 1, wherein the phenolic compound is a compound of the following formula,

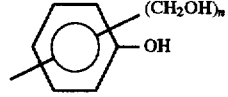

wherein n is 2 or 3, or a hydrative condensate of a compound of the above formula.

6. An adhesive according to claim 1, wherein the phenolic compound has a weight average molecular weight of 150 to 1,500.

7. An adhesive sheet for semiconductor devices, wherein the adhesive of claim 1 is in the form of a sheet.

8. An adhesive tape for semiconductor devices, obtained by forming a layer of the adhesive of claim 1 on a protection film and forming an organic insulation film on the layer of the adhesive.

* * * * *